US011697877B2

United States Patent
Bansal et al.

(10) Patent No.: US 11,697,877 B2
(45) Date of Patent: *Jul. 11, 2023

(54) HIGH TEMPERATURE FACE PLATE FOR DEPOSITION APPLICATION

(71) Applicant: Applied Materials, Inc., Santa Clara, CA (US)

(72) Inventors: Amit Kumar Bansal, Milpitas, CA (US); Saket Rathi, Santa Clara, CA (US); Tuan Anh Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 17/646,176

(22) Filed: Dec. 28, 2021

(65) Prior Publication Data

US 2022/0119950 A1   Apr. 21, 2022

Related U.S. Application Data

(63) Continuation of application No. 16/904,169, filed on Jun. 17, 2020, now Pat. No. 11,242,600.

(51) Int. Cl.
*C23C 16/40* (2006.01)
*C23C 16/455* (2006.01)

(52) U.S. Cl.
CPC .............. *C23C 16/45591* (2013.01)

(58) Field of Classification Search
CPC ........... C23C 16/45591; C23C 16/455; C23C 16/4557
USPC .............. 118/715, 728, 50, 724; 156/345.33, 156/345.34, 345.35, 345.36, 345.26, 156/345.51, 345.37, 345.29
See application file for complete search history.

(56) References Cited

U.S. PATENT DOCUMENTS

| | | | |
|---|---|---|---|
| 5,306,895 A * | 4/1994 | Ushikoshi | C04B 35/581 118/725 |
| 5,785,796 A * | 7/1998 | Lee | C23C 14/564 156/345.24 |
| 5,882,411 A | 3/1999 | Zhao et al. | |

(Continued)

FOREIGN PATENT DOCUMENTS

| | | |
|---|---|---|
| JP | 2019-068090 A | 4/2019 |
| WO | 2011-146571 A2 | 11/2011 |
| WO | 2019/203975 A1 | 10/2019 |

OTHER PUBLICATIONS

PCT Notification of Transmittal of the International Search Report and the Written Opinion of the International Searching Authority for International Application No. PCT/US2021/032913; dated Sep. 8, 2021.

*Primary Examiner* — Rudy Zervigon
(74) *Attorney, Agent, or Firm* — Patterson +Sheridan, LLP

(57) ABSTRACT

Embodiments of the disclosure relate to faceplates for a processing chamber. In one example, a faceplate includes a body having a plurality of apertures formed therethrough. A heating element is disposed within the body, and the heating element circumscribes the plurality of apertures. A support ring is disposed the body. The support ring circumscribes the heating element. The support ring includes a main body and a cantilever extending radially inward from the main body. The cantilever contacts the body of the faceplate.

20 Claims, 7 Drawing Sheets

(56) References Cited

U.S. PATENT DOCUMENTS

| | | | |
|---|---|---|---|
| 5,919,332 A * | 7/1999 | Koshiishi | H01J 37/32633 156/345.47 |
| 5,976,260 A * | 11/1999 | Kinoshita | H01L 21/6838 118/719 |
| 6,086,677 A | 7/2000 | Umotoy et al. | |
| 6,453,992 B1 * | 9/2002 | Kim | C23C 16/4557 165/206 |
| 6,905,079 B2 * | 6/2005 | Kuwada | C23C 16/4557 239/13 |
| 6,946,033 B2 * | 9/2005 | Tsuei | C23C 16/45565 118/715 |
| 7,520,957 B2 * | 4/2009 | Kao | H01L 21/67069 156/345.43 |
| 7,661,386 B2 * | 2/2010 | Kasai | C23C 16/45565 118/666 |
| 7,743,730 B2 * | 6/2010 | Kholodenko | H01J 37/32458 118/723 E |
| 7,850,779 B2 * | 12/2010 | Ma | C23C 16/509 118/715 |
| 8,128,751 B2 * | 3/2012 | Kasai | C23C 16/45572 118/715 |
| 8,313,610 B2 * | 11/2012 | Dhindsa | H01J 37/32091 156/345.27 |
| 8,485,127 B2 * | 7/2013 | Nishimoto | C23C 16/46 118/723 MW |
| 8,701,268 B2 * | 4/2014 | Larson | C23C 16/45565 29/592.1 |
| 8,846,163 B2 * | 9/2014 | Kao | C23C 14/50 427/545 |
| 9,032,906 B2 | 5/2015 | Ma et al. | |
| 9,034,142 B2 | 5/2015 | Bartlett et al. | |
| 9,677,176 B2 | 6/2017 | Chandrasekharan et al. | |
| 9,934,942 B1 * | 4/2018 | Lubomirsky | H01J 37/3244 |
| 9,972,477 B2 * | 5/2018 | Tan | H01J 37/32357 |
| 9,978,564 B2 * | 5/2018 | Liang | C23C 16/45565 |
| 10,224,180 B2 * | 3/2019 | Lubomirsky | H01J 37/3053 |
| 10,319,603 B2 * | 6/2019 | Chen | H01L 21/02323 |
| 10,354,843 B2 * | 7/2019 | Liang | C23C 16/45582 |
| 10,373,810 B2 * | 8/2019 | Noorbakhsh | H01J 37/32568 |
| 10,541,113 B2 * | 1/2020 | Lubomirsky | H01J 37/3002 |
| 10,780,447 B2 * | 9/2020 | Fovell | C23C 16/45572 |
| 10,954,595 B2 * | 3/2021 | Noorbakhsh | C23C 16/50 |
| 11,024,486 B2 * | 6/2021 | Lubomirsky | H01L 21/32136 |
| 11,043,360 B2 * | 6/2021 | Carducci | H01J 37/32009 |
| 2002/0029748 A1 * | 3/2002 | Kuwada | C23C 16/45572 118/724 |
| 2003/0205202 A1 * | 11/2003 | Funaki | C23C 16/54 118/723 E |
| 2004/0050492 A1 * | 3/2004 | Tsuei | C23C 16/5096 156/345.33 |
| 2005/0000423 A1 * | 1/2005 | Kasai | C23C 16/45565 118/715 |
| 2005/0000430 A1 * | 1/2005 | Jang | C23C 16/45565 118/715 |
| 2005/0003600 A1 * | 1/2005 | Kasai | C23C 16/4411 438/200 |
| 2005/0205110 A1 * | 9/2005 | Kao | H01J 37/32082 134/1.1 |
| 2005/0218507 A1 * | 10/2005 | Kao | C23C 14/50 257/704 |
| 2005/0221552 A1 * | 10/2005 | Kao | H01L 21/67109 438/200 |
| 2005/0230350 A1 * | 10/2005 | Kao | H01J 37/32568 216/67 |
| 2006/0027165 A1 * | 2/2006 | Sen | H01L 21/67103 118/715 |
| 2006/0051966 A1 * | 3/2006 | Or | H01L 21/00 438/706 |
| 2007/0137573 A1 * | 6/2007 | Kholodenko | H01L 21/67069 118/723 E |
| 2007/0175396 A1 * | 8/2007 | Kasai | H01J 37/3244 118/723 R |
| 2008/0268171 A1 * | 10/2008 | Ma | C23C 16/509 427/569 |
| 2008/0268645 A1 * | 10/2008 | Kao | H01L 21/67109 438/694 |
| 2009/0081878 A1 * | 3/2009 | Dhindsa | H05B 3/03 438/729 |
| 2009/0095218 A1 | 4/2009 | Weinhold et al. | |
| 2009/0095621 A1 * | 4/2009 | Kao | H01L 21/67109 204/298.32 |
| 2009/0111280 A1 * | 4/2009 | Kao | C23C 14/541 438/761 |
| 2009/0133835 A1 * | 5/2009 | Nishimoto | C23C 16/511 156/345.27 |
| 2009/0151639 A1 * | 6/2009 | Kasai | H01L 21/76843 118/724 |
| 2011/0180233 A1 * | 7/2011 | Bera | H01L 21/67109 165/47 |
| 2012/0234945 A1 * | 9/2012 | Olgado | B05B 1/005 239/589 |
| 2012/0267346 A1 * | 10/2012 | Kao | C23C 14/50 219/121.52 |
| 2014/0076234 A1 * | 3/2014 | Kao | H01J 37/32568 118/719 |
| 2014/0227881 A1 * | 8/2014 | Lubomirsky | H01J 37/32422 438/710 |
| 2015/0011096 A1 | 1/2015 | Chandrasekharan et al. | |
| 2015/0380218 A1 * | 12/2015 | Tan | H01J 37/32568 156/345.33 |
| 2016/0005571 A1 * | 1/2016 | Della Rosa | H01J 37/3288 156/345.34 |
| 2016/0343595 A1 | 11/2016 | Lind et al. | |
| 2017/0304849 A1 * | 10/2017 | Fovell | H01J 37/32449 |
| 2017/0306491 A1 * | 10/2017 | Liang | C23C 16/458 |
| 2017/0365443 A1 * | 12/2017 | Carducci | H01J 37/3244 |
| 2019/0119816 A1 * | 4/2019 | Zhang | C23C 16/4557 |
| 2019/0226088 A1 | 7/2019 | Zhang et al. | |
| 2019/0326100 A1 * | 10/2019 | Noorbakhsh | B05B 1/005 |
| 2020/0040452 A1 | 2/2020 | Hwung et al. | |

* cited by examiner

HIGH TEMPERATURE FACE PLATE FOR DEPOSITION APPLICATION

CROSS-REFERENCE TO RELATED APPLICATIONS

This Application is a continuation of and hereby claims priority under 35 U.S.C. § 120 to pending U.S. patent application Ser. No. 16/904,169, filed Jun. 17, 2020, the contents of which are incorporated herein in their entirety.

BACKGROUND

Field

Embodiments of the present disclosure generally relate to a heated faceplate for use in substrate processing chambers.

Description of the Related Art

In the fabrication of integrated circuits, deposition processes such as chemical vapor deposition (CVD) or atomic layer deposition (ALD) are used to deposit films of various materials upon semiconductor substrates. In other operations, a layer altering process, such as etching, is used in a repetitive fashion to fabricate various layers of an electronic device, such as a semiconductor device.

Fabricating a defect free semiconductor device is desirable when assembling integrated circuits and as the need for improved devices continues to grow, so too does the need for improved methods and apparatuses for manufacturing such devices. The chemistry used in new processes, such as precursor gases, is continually requiring increased process control, such as temperature control, to carry out such processes to predetermined specifications. Accordingly, there is a need in the art for process chamber components that can provide increased temperature control for device manufacturing and processing.

SUMMARY

In one embodiment, a faceplate for a processing chamber comprises a body having a plurality of apertures formed therethrough; a heating element disposed within the body, the heating element circumscribing the plurality of apertures; and a support ring disposed in the body, the support ring circumscribing the heating element, the support ring including a main body and a cantilever extending radially inward from the main body, the cantilever contacting the body of the faceplate.

In another embodiment, a faceplate for a processing chamber comprises a body having a plurality of apertures formed therethrough, the body comprising a first extension and a second extensions each extending outward from an outer surface of the body, the first extension and the second extension together defining a recess, each of the first extension and the second extension have a greater thickness at a radially outward edge thereof compared to a radially inward edge thereof. The faceplate also comprises a heating element disposed within the body, the heating element circumscribing the plurality of apertures, the heating element located radially inward of the first extension and the second extension. The faceplate additionally comprises a support ring disposed in the recess of the body, the support ring comprising a main body and circumscribing the heating element, wherein the radially outward edge of each of the first and second extensions is in contact with the support ring, and the radially inward edge of each of the first and second support rings is spaced apart from the support ring.

In another embodiment, a process chamber comprises a chamber body; a substrate support disposed in the chamber body; and a lid assembly disposed on the chamber body, the lid assembly comprising: a body having a plurality of apertures formed therethrough; a heating element disposed within the body, the heating element circumscribing the plurality of apertures; and a support ring disposed in the body, the support ring circumscribing the heating element, the support ring including a main body and a cantilever extending radially inward from the main body, the cantilever contacting the body of the faceplate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 2 illustrates faceplate 138 adjacent the blocker plate 136 and the side wall 104 of the chamber body 102.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to an apparatus for gas distribution in a process chamber. More specifically, aspects of the present disclosure relate to a metal faceplate. The faceplate has a body formed from a distribution portion surrounded by a coupling portion. A heater is disposed within the distribution portion to heat the body to an elevated temperature. A support ring is disposed within the coupling portion of the faceplate. A cantilever extends from the support ring, creating a load bearing point to support the faceplate. Gaps are disposed between the support ring and the faceplate. The gaps act as thermal chokes and limit heat transfer between the distribution portion and the coupling portion of the faceplate.

Figure 1A:
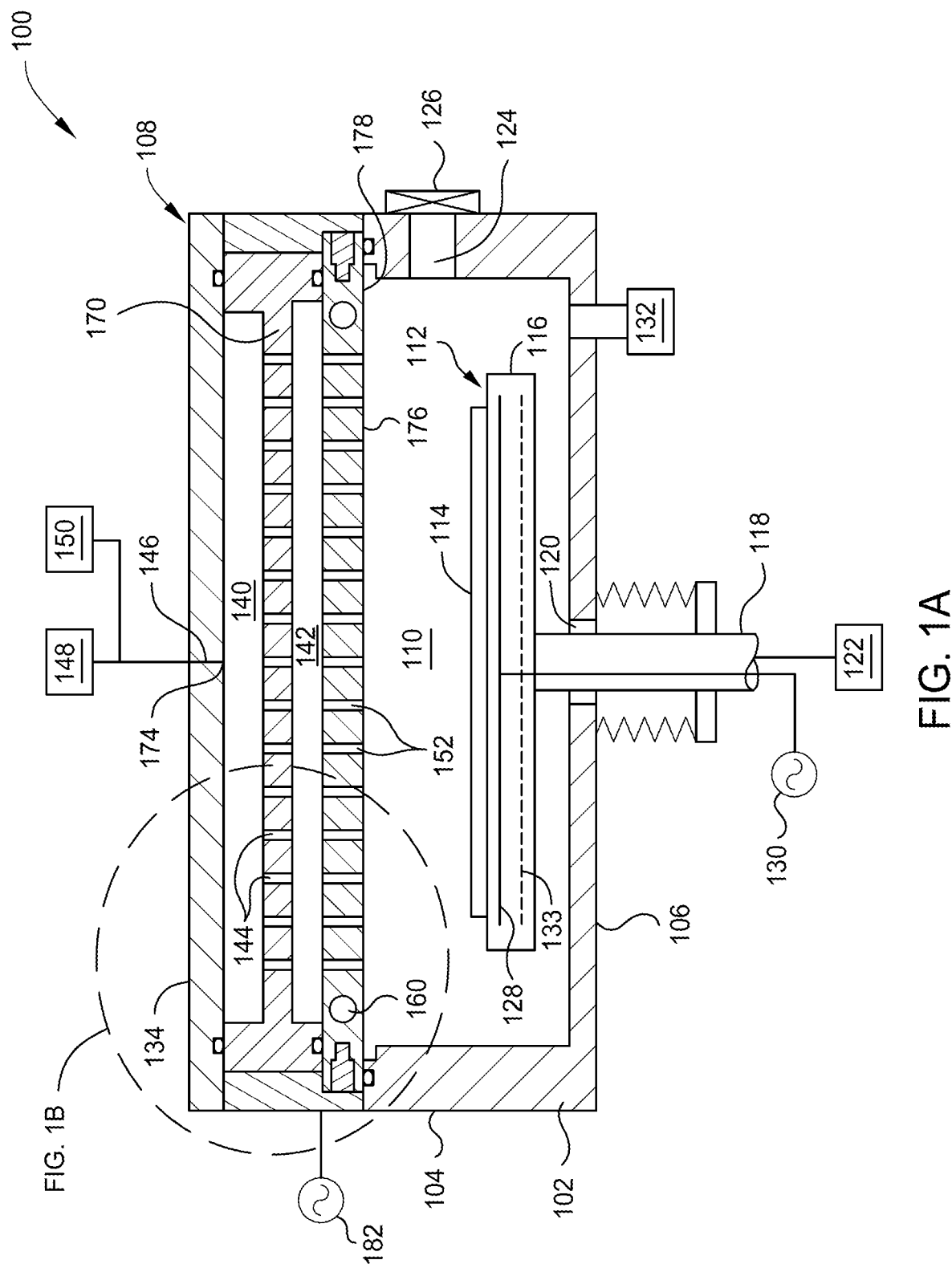
FIG. 1A illustrates a schematic, cross-sectional view of a process chamber according to one embodiment of the present disclosure.
Figure 1B:
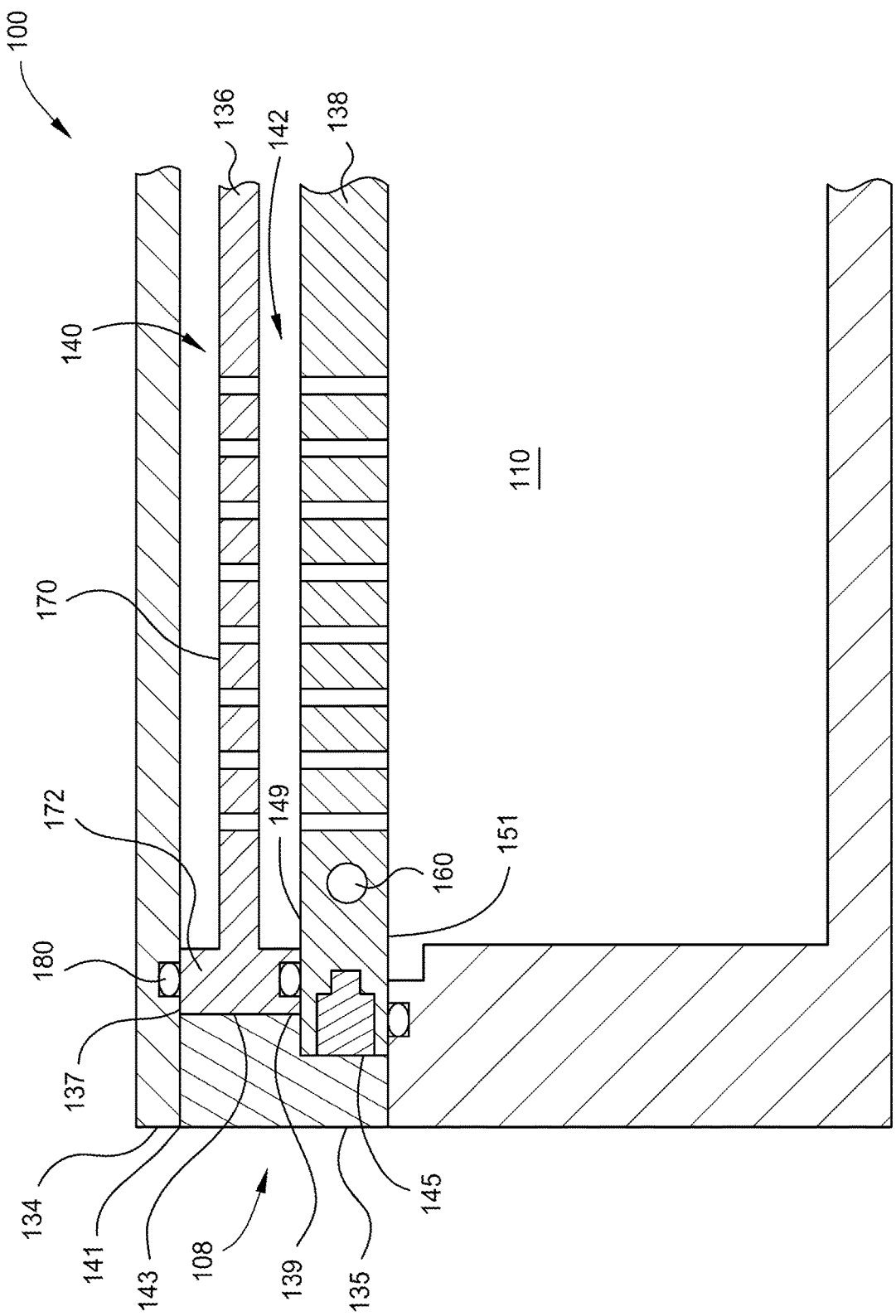
FIG. 1B illustrates an enlarged, partial view of the process chamber of FIG. 1A.

FIG. 1A illustrates a schematic cross-sectional view of a process chamber 100 according to one embodiment. FIG. 1B illustrates an enlarged, schematic view of details of the process chamber 100. The process chamber 100 includes a body 102 having a side wall 104 and a base 106. A lid assembly 108 is coupled to the body 102. The body 102 and lid assembly 108 define process volume 110. The body 102 is formed from a metallic material, such as aluminum or stainless steel, but other material suitable for use with the process therein is contemplated. A substrate support 112 is disposed with the process volume 110 and supports a substrate 114 during processing. The substrate support 112 includes a support body 116 coupled to a shaft 118. The shaft 118 is coupled to a lower surface of the support body 116 and extends out of the body 102 through an opening 120 in the base 106. The shaft 118 is coupled to an actuator 122. The actuator 122 vertically actuates the shaft 118, and support body 116 coupled thereto, between a substrate loading position and a substrate processing position. To facilitate processing of a substrate 114 in the process chamber 100, the substrate 114 is disposed on an upper surface of the support body 116 opposite of the shaft 118.

A port 124 is formed in the side wall 104 to facilitate ingress and egress of the substrate 114 into the process volume 110. A door 126, such as a slit valve, is actuated to selectively enable the substrate 114 to pass through the port 124 to be loaded onto, or removed from, the support body 116. An electrode 128 is optionally disposed within the support body 116 and electrically coupled to a power source 130 through the shaft 118. The electrode 128 is selectively biased by the power source 130 to create an electromagnetic field to chuck the substrate 114 to the support body 116. In certain embodiments, a heater 133, such as a resistive heater, is disposed within the support body 116 to heat the substrate 114 disposed thereon.

An inlet port 174 is disposed within the lid 134. The inlet port 174 is fluidly coupled to a gas conduit 146. The gas conduit 146 enables a gas to flow from a first gas source 148, such as a process gas source, through the inlet port 174 into the first volume 140. A second gas source 150, may supply a cleaning gas in order to remove particle depositions from internal surfaces of the processing chamber 100. A seal 180, such as an O-ring, is disposed in a groove, such as a dovetail groove, between the blocker plate 136 and the lid 134 at the annular extension 172 in order to isolate the process volume 110 from the external environment, enabling maintenance of the vacuum therein by the vacuum system 132.

A vacuum system 132 is fluidly coupled to the process volume 110 in order to evacuate gases from the process volume 110.

The lid assembly 108 includes a lid 134, a blocker plate 136, a faceplate 138, and a clamp 135. The blocker plate 136 includes a recessed circular distribution portion 170 surrounded by an annular extension 172. The blocker plate is disposed between the lid 134 and the faceplate 138 and is coupled to the lower surface 141 of the lid 134 and the upper surface 149 of the faceplate 138 at the annular extension 172. The clamp 135 is coupled to the lower surface of the lid 134, the outer surface 143 of the blocker plate 136, the outer edge 145 of the support ring 158 (shown in FIG. 2), and the upper surface 105 of the side wall 104. The clamp 135 facilitates securing the faceplate 138. The lid 134 couples to the upper surface 137 of the annular extension 172 opposite the body 102. The faceplate 138 couples to the lower surface 139 of the annular extension 172. A first volume 140 is defined between the blocker plate 136 and the lid 134. A second volume 142 is defined between the blocker plate 136 and the lower portion 151 of the faceplate 138. A plurality of apertures 144 are formed through the distribution portion 170 of the blocker plate 136 and facilitate fluid communication between the first volume 140 and the second volume 142.

The faceplate 138 has a distribution portion 176 and a coupling portion 178 (shown in FIG. 2) disposed radially outward of the distribution portion 176. The distribution portion 176 is disposed between the process volume 110 and the second volume 142 and facilitates fluid flow there between. The coupling portion 178 surrounds the distribution portion 176 at a periphery of the faceplate 138. To facilitate processing of a substrate 112, a RF generator 182 may be coupled to the faceplate 138 to excite a gas from the first gas source 148, the second gas source 150, or both the first gas source 148 and the second gas source 150 to form an ionized species. In one embodiment, the RF generator 182 and the faceplate 138, in conjunction with the electrode 128, facilitate generation of a capacitively coupled plasma within the process volume 110.

One or more apertures 152 are disposed through the faceplate 138 within the distribution portion 176. The apertures 152 enable fluid communication between the second volume 142 and the process volume 110. In operation, a gas flows from the inlet port 174 into the first volume 140, through the plurality of apertures 144 in the blocker plate 136 into the second volume 142, through the plurality of apertures 152 in the faceplate 138, and into process volume 110. The arrangement and sizing of apertures 152 enable the selective flow of the gas into the process volume 110 in order to achieve the desired gas distribution. In one embodiment, a uniform gas distribution may be desired and that is achieved by the selective flow of gas into the process volume 110.

One or more heating elements 160 are disposed in the faceplate 138. In one embodiment, the heating elements 160 are disposed radially outward of the apertures 152. The heating elements 160 may be any element capable of providing heat to the faceplate 138. In one embodiment, the heating element 160 includes a resistive heater, which may be embedded within and encircling the apertures 152 of the faceplate 138. The heating element 160 heats the faceplate 138 to a high temperature, such as 300° C. and higher. For example the heating element 160 may heat the faceplate to 400° C., 500° C., or higher. Increasing the temperature of the faceplate 138 during processing to a temperature of 300° C., 400° C., 500° C., or higher results in reduced particle formation on the faceplate 138 which translates to improved deposition on, and processing of, substrate 114, while also increasing tool uptime.

Figure 2:
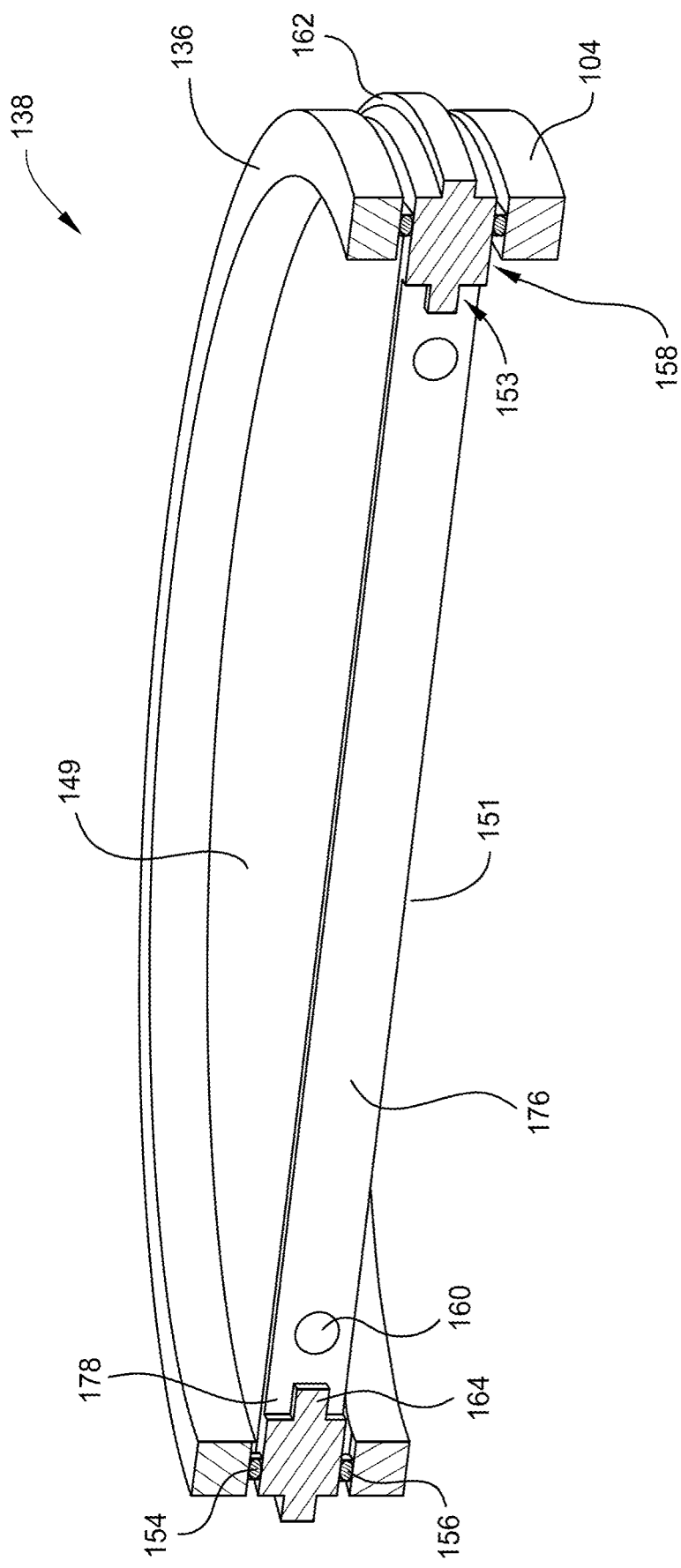
FIG. 2 illustrates an enlarged, partial view of the process chamber 100 of FIGS. 1A and 1B according to one embodiment of the present disclosure. In particular.

FIG. 2 illustrates an enlarged, partial view of the process chamber 100 of FIG. 1A according to one embodiment of the present disclosure. In particular, FIG. 2 illustrates faceplate 138 adjacent the blocker plate 136 and the side wall 104 of the chamber body 102.

A recess 153 is formed in the radially outward edge of coupling portion 178 of the faceplate 138. A support ring 158 is disposed within the recess 153 formed in the coupling portion 178 of the faceplate 138. The support ring 158 is disposed radially outward of both the distribution portion 176 and the heating element 160 of the faceplate 138. Seals 154 and 156 are disposed above and below coupling portion 178 of the faceplate 138. Seals 154 and 156 are disposed within dovetailed grooves in the blocker plate 136 and chamber support 104. Seals 154 and 156 may be O-rings that provide a vacuum seal to the process volume 110. The support ring 158 provides structural and coupling support of the faceplate 138. The support ring 158 is composed of a material such as, but not limited to, aluminum, aluminum oxide, aluminum nitride, silicon oxide, silicon nitride, or stainless steel. The support ring 158 has a main body 161, a lip 162 disposed on the outer edge 145 of the support ring 158. The lip 162 extends radially outward from the support ring 158 and facilitates handling the faceplate 138 during preventative maintenance.

The support ring 158 additionally includes a radially inward cantilever 164. The cantilever 164 is positioned opposite the lip 162, and extends radially inward from an inner surface 163 of the support ring 158. The cantilever 164 provides structural support and a weight-bearing surface for the faceplate 138. For example, the cantilever 164 prevents drooping of the faceplate 138, resulting in improved deposition and increased uniformity and processing of substrate 112. Minimum contact and the lower thermal conductivity of the support ring 158 traps heat within the faceplate 138 resulting in limited power used to heat the faceplate and helps in meeting the thermal budget target.

Figure 3:
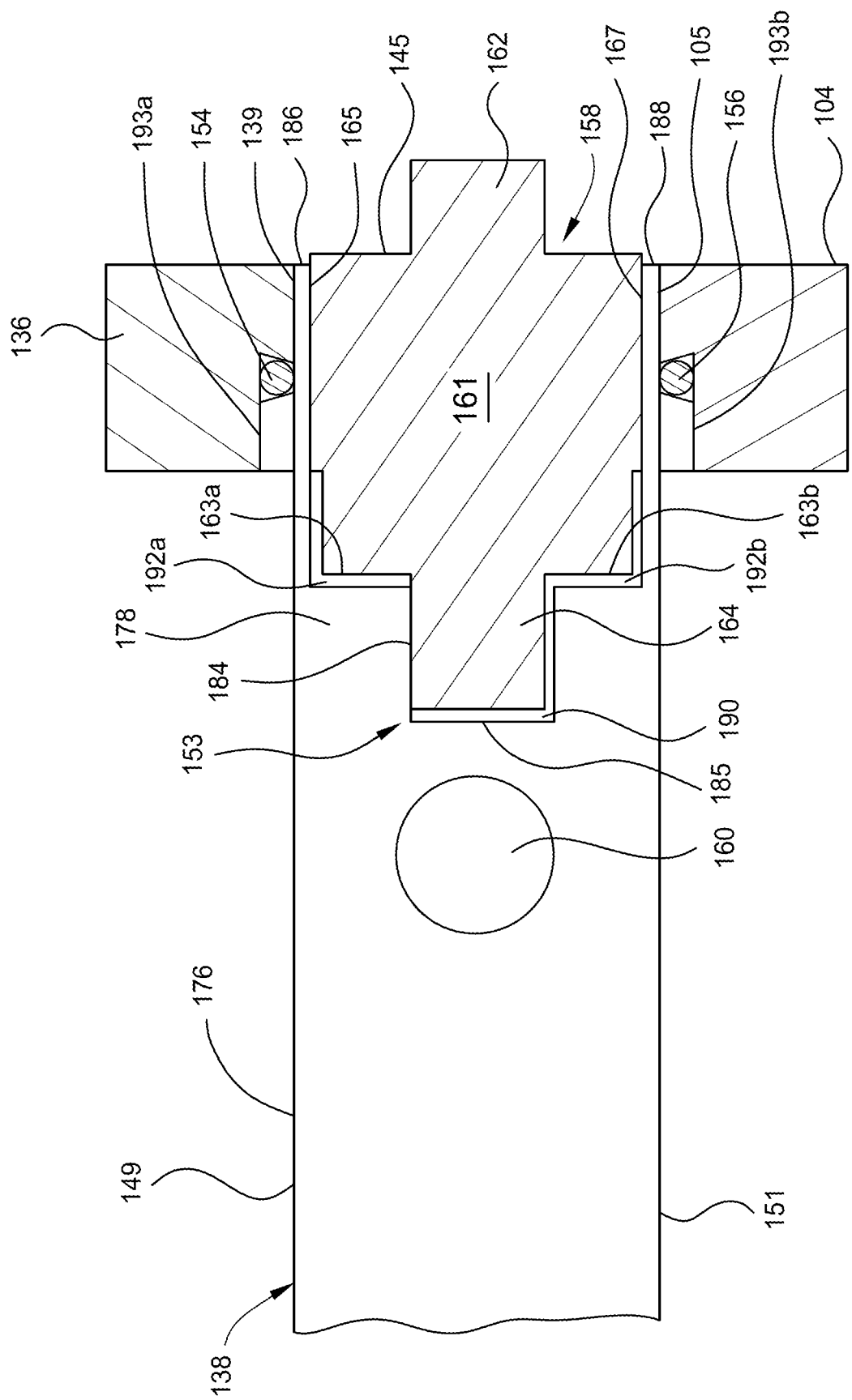
FIG. 3 illustrates an enlarged view of a coupling portion of the faceplate depicted in FIG. 2.

FIG. 3 illustrates an enlarged view of a coupling portion 178 of the faceplate 138 depicted in FIG. 2. As shown in FIG. 3, the support ring 158 engages a recess 153 formed around the circumference of the faceplate 138. The faceplate includes a stepped surface which corresponds to the shape of the radially inward surface of the support ring 158. To facilitate assembly of the faceplate 138 and the support ring 158, the support ring 158 may be formed from multiple segments which can be assembled to form a complete loop around the faceplate 138.

When the support ring 158 is assembled with the faceplate 138, the support ring 158 makes contact with the faceplate 138 only in selected locations within the recess 153, which minimizes heat transfer there between. For example, the support ring 158 contacts the faceplate 138 at (1) a top surface 184 of the cantilever 164; (2) a radially outward edge of the upper surface 165 of the main body 161 of the support ring 158; and (3) a radially outward edge of the lower surface 167 of the main body 161 of the support ring 158. The top surface 184 of the cantilever 164 is the load bearing structure of the support ring 158. In one embodiment which can be combined with other embodiments, the cantilever 164 has a nominal thickness of about 8 millimeters (mm) to 20 mm. In another embodiment, cantilever 164 is about 10 mm thick.

In locations within the recess 153 in which the edge support ring 158 does not contact the faceplate 138, gaps, such as gaps 190, 192a, and 192b, are formed. Gaps 190, 192a, and 192b are spaces disposed radially between the faceplate 138 and the support ring 158. Gap 190 is disposed between the cantilever 164 and the side wall 185 of the recess 153. In one embodiment, as depicted in FIG. 3, gap 192a is disposed between the inner surface 163a of the support ring 158 and extends at least partially over the upper surface 165 of the main body 161 of the support ring 158 and gap 192b is disposed between the inner surface 163b and extends at least partially under the lower surface 167 of the main body 161 of the support ring 158. In another embodiment, gap 192a is disposed between the inner surface 163a of the support ring 158 and the stepped lower surface of the extension 186. Gap 192b is disposed between the inner surface 163b of the support ring 158 and the stepped upper surface of the extension 188. Gaps 190, 192a, and 192b minimize the contact area between the faceplate 138 and the support ring 158 to limit heat transfer from the heating element 160 to the seals 154, 156 to prevent degradation thereof, keeping the temperature of the seals 154, 156 low (e.g., below a degradation temperature thereof) and reducing the power requirement to the heating element 160. The gaps 190, 192a, and 192b provide thermal choking and additionally provide space for thermal expansion. In one embodiment which can be combined with other embodiments, the width of the gaps 190, 192a, or 192b is about 0.1 mm to 5 mm, such as about 0.5 mm to 2 mm. It is understood that the size, shape, and arrangement of the gaps 190, 192a, 192b disposed around the support ring 158 may be selected in relation to desired rate of heat transfer across the coupling portion 178. Further, the depth, width, and cross section of the gaps 190, 192a, and 192b may be adjusted as desired. Any arrangement of gaps, channels, grooves, recesses, or cutouts capable of minimizing heat transfer may be utilized as thermal breaks.

The coupling portion 178 has extensions 186 and 188 which partially define recess 153. Extensions 186 and 188 provide a primary thermal choking feature of the design. The decreased cross sectional area of extensions 186 and 188 provide reduced thermal conduction resulting in thermal choking within the coupling portion 178. The extension 186 has a planar upper surface and a stepped lower surface. The planar upper surface of the extension 186 is adjacent to the lower surface 139 of the blocker plate 136. The extension 186 extends over the upper surface 165 of the main body 161 of the support ring 158. The extension 186 is at least partially in contact with the upper surface 165 of the main body 161 of the support ring 158. The stepped lower surface 189 of the extension 186 is located between the radially inward surface of the support cantilever 164 and the faceplate 138. The extension 188 has a planar lower surface and a stepped upper surface. The planar lower surface of the extension 188 is adjacent to the upper surface 105 of the side wall 104. The extension 188 extends below the bottom surface of the support ring 158. The extension 188 is at least partially in contact with the bottom surface of support ring 158. The extensions 186 and 188 provide thermal choking from the distribution portion 176 to the coupling portion 178 by creating additional gaps above/below the main body 161 due to the presence of the respective stepped surface. The thermal choking provided by the extensions 186, 188 limit heat transfer from heating element 160 to vacuum seals 154 and 156. Extensions 186 and 188 are thin-walled portions of the faceplate 138. In one embodiment which can be combined with other embodiments, extensions 186 and 188 have a nominal thickness of about 0.5 mm to 5 mm such as about 0.5 mm to 3 mm thick. It is understood that the depth, width, and cross section of the extensions 186 and 188 disposed around the support ring 158 may be selected in relation to desired rate of heat transfer across the coupling portion 178.

Gaps 193a and 193b are also utilized as thermal breaks. Gaps 193a provides a thermal break between the blocker plate 136 and the extension 186. Gap 193a is defined by a recess disposed in the lower surface 139 of blocker plate 136 adjacent to vacuum seal 154. Gap 193b provides a thermal break between the side wall 104 and the extension 188. The gap 193b is defined by a recess in the upper surface 105 of the side wall 104 adjacent to vacuum seal 156. The depth, width, and cross section of gaps 193a and 193b may be selected in relation to desired rate of heat transfer from the faceplate 138 to seals 154 and 156.

Figure 4:
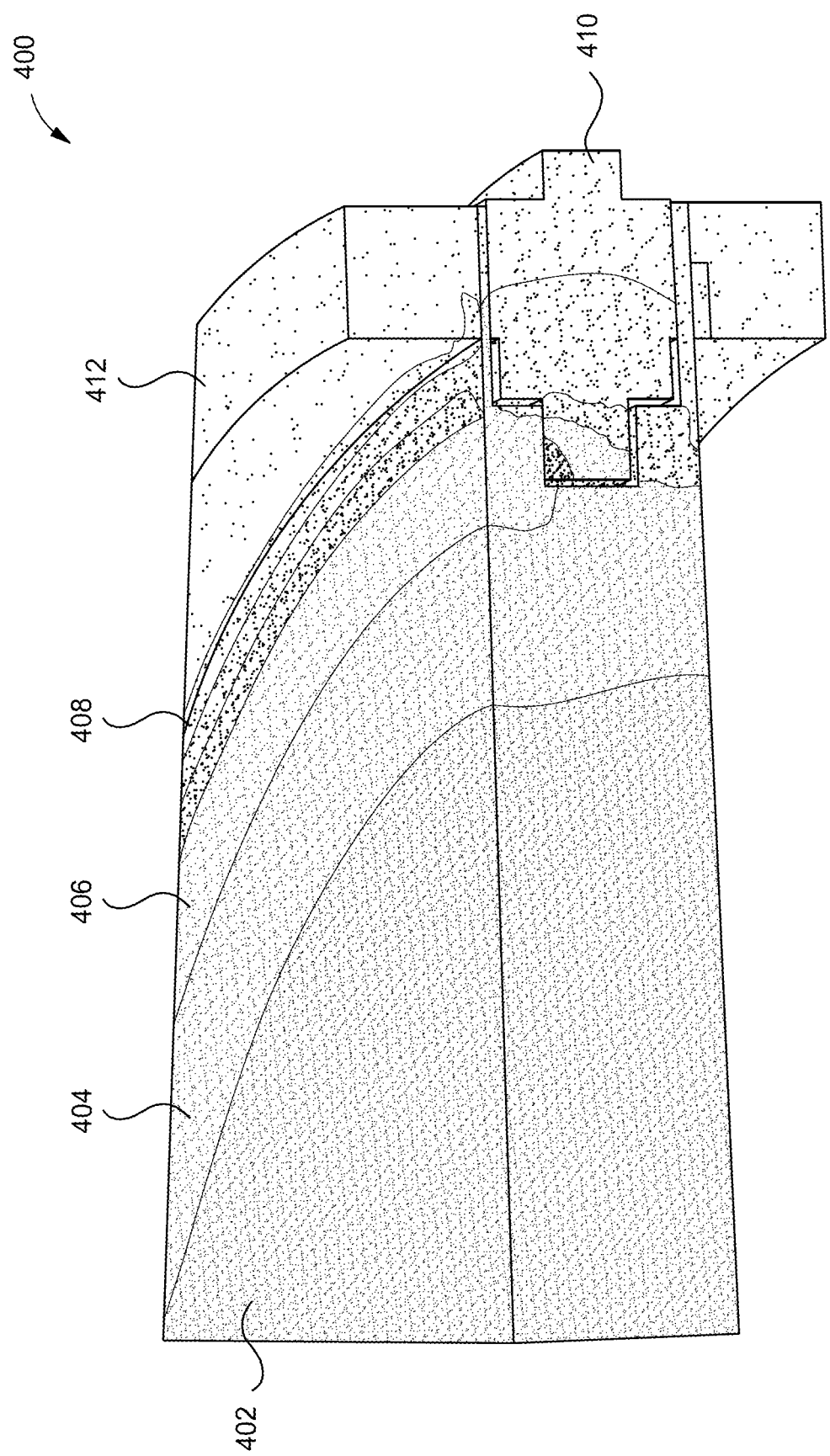
FIG. 4 illustrates a temperature of the faceplate according to one embodiment of the present disclosure.

FIG. 4 depicts a temperature gradation across a faceplate 400. The 400 is similar to faceplate 138. The temperature is warmest at region 402 which includes the distribution portion 176 (shown in FIG. 1A) of faceplate 400. The temperature cools gradually in the radially outward direction such that region 412 may have the coolest temperature on faceplate 400. The faceplate 400, as depicted in FIG. 4, has regions 402, 404, 406, 408, 410, and 412 depicting different temperatures across faceplate 400. FIG. 4 is an exemplary embodiment and there may be fewer or more regions. In an exemplary embodiment, as depicted in FIG. 4, the temperature of region 402 may be about 350° C. or greater. The temperature of region 404 may be about 25° C.-40° C. less than that of the temperature of region 402, such that the temperature of region 404 may be about 310° C.-325° C. Region 406 includes at least a portion of the coupling portion 178 (shown in FIG. 1) of the faceplate 400. The temperature of region 406 may be about 10-15° C. less than the temperature of region 404, such that region 406 has a temperature of about 300° C. The temperature of region 408 is about 270° C.-280° C. The temperature of region 408 is about 20° C.-30° C. cooler than region 406. The lower temperature of region 408 is due to the gaps 190, 192a, and 192b (shown in FIG. 3). The temperature of region 410 is about 180° C.-210° C. The temperature of region 412 is about 150° C.-170° C.

Figure 5A:
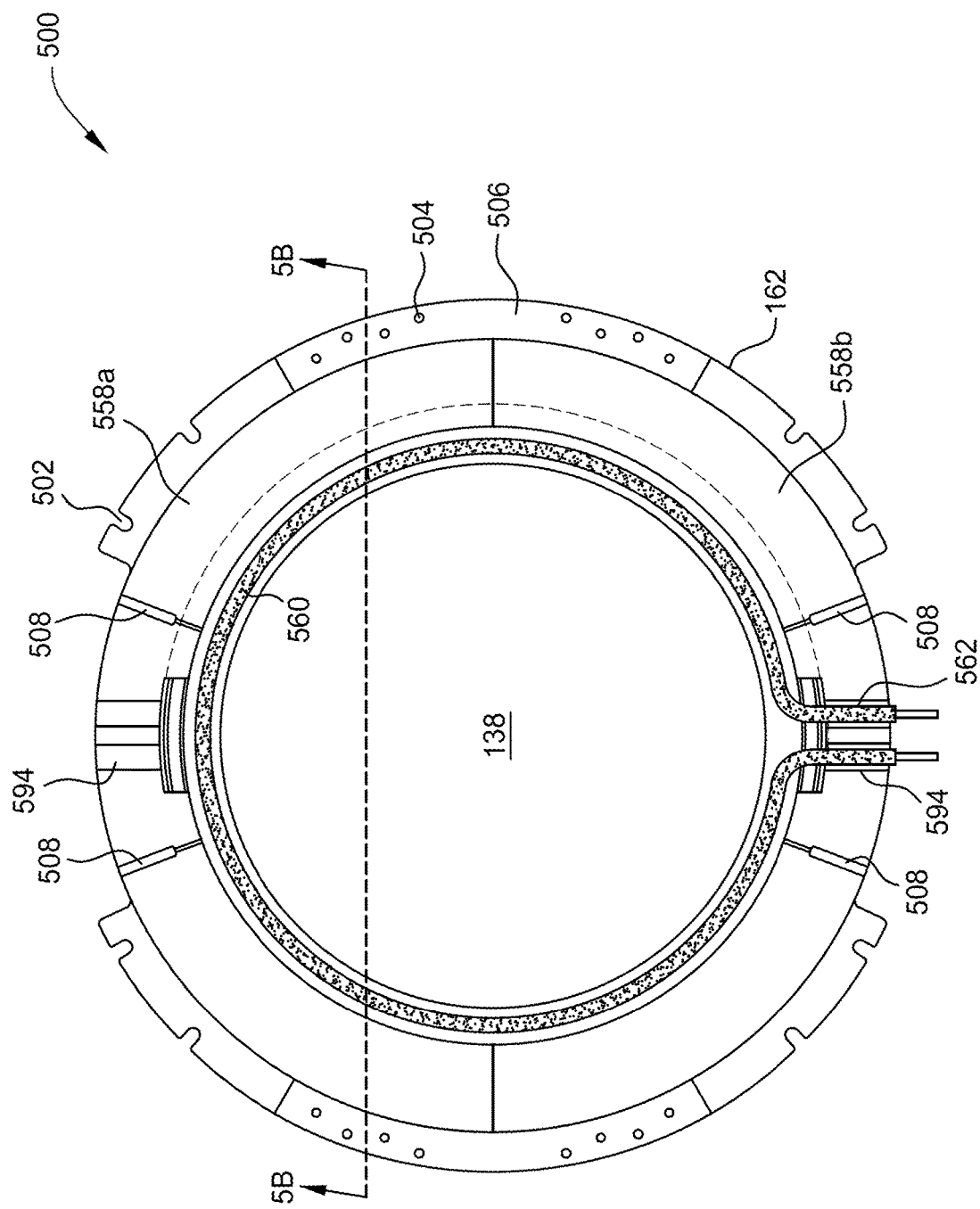
FIG. 5A illustrates a view of a faceplate assembly, according to another embodiment of the disclosure.

FIG. 5A is a cross sectional view of a faceplate assembly 500. The faceplate assembly 500 may include one or more aspects described above without further recitation.

The faceplate assembly 500 is a modular assembly including one or more components. For example, the faceplate assembly includes a first support section 558a and a second support section 558b, which together form a ring when engaged with one another. In one example, the first support section 558a and the second support section 558b each extend 180 degrees. However, other dimensions are contemplated. The first support section 558a and the second support section 558b surround and secure a faceplate 138. A concentric heating element 560 is embedded within the faceplate 138 to facilitate heating of the faceplate 138. In one example, the faceplate 138 is made by adhering (e.g., welding or brazing) two plates together, with the heating element 560 positioned at the interface therebetween. The concentric heating element 560 has connecting ends 562 extending form the faceplate 138 to facilitate connection to a power source. The connecting ends 562 are positioned in respective openings 594 formed in the support section 558. The support section 558a may have corresponding openings 594, which facilitate positioning the connecting ends 562 in a direction which is 180 degrees from that illustrated in FIG. 5A. Thus, the faceplate assembly 500 can be used in chambers of various configurations (such as in dual chamber platforms), without the need for chamber-specific components. Although the openings 594 are positioned about 90 degrees from adjoining surfaces of the first and second support sections 558a, 558b, other locations are also contemplated.

Temperature sensors 508 (four are shown) are disposed through the each support section 558a, 558b. Temperature sensors 508 are used for determining and regulating the temperature of the faceplate 138. In one example, the temperature sensors flank the openings 594. It is contemplated that more or less than four temperature sensors 508 may be utilized.

The first and second support sections 558a and 558b are connected with an installation bracket 506. The installation bracket 506 connects the support rings 558a, 558b by adhering to adjacent lips 162 on the first and second support sections 558a, 558b. In one example, each of the first support section 558a and the second support section 558b includes two lips 162, positioned at lateral ends of the first support section 158a and the second support section 158. A plurality of holes 504 are formed through each lip 162 and through the installation bracket 506, and aligned with one another to accommodate a fastener therein. Each lip 162 also includes one or more notches 502 (two are shown in each lip 162) that are used for locating and clamping the faceplate 138 within a processing chamber 100 (as shown in FIG. 1A).

Figure 5B:
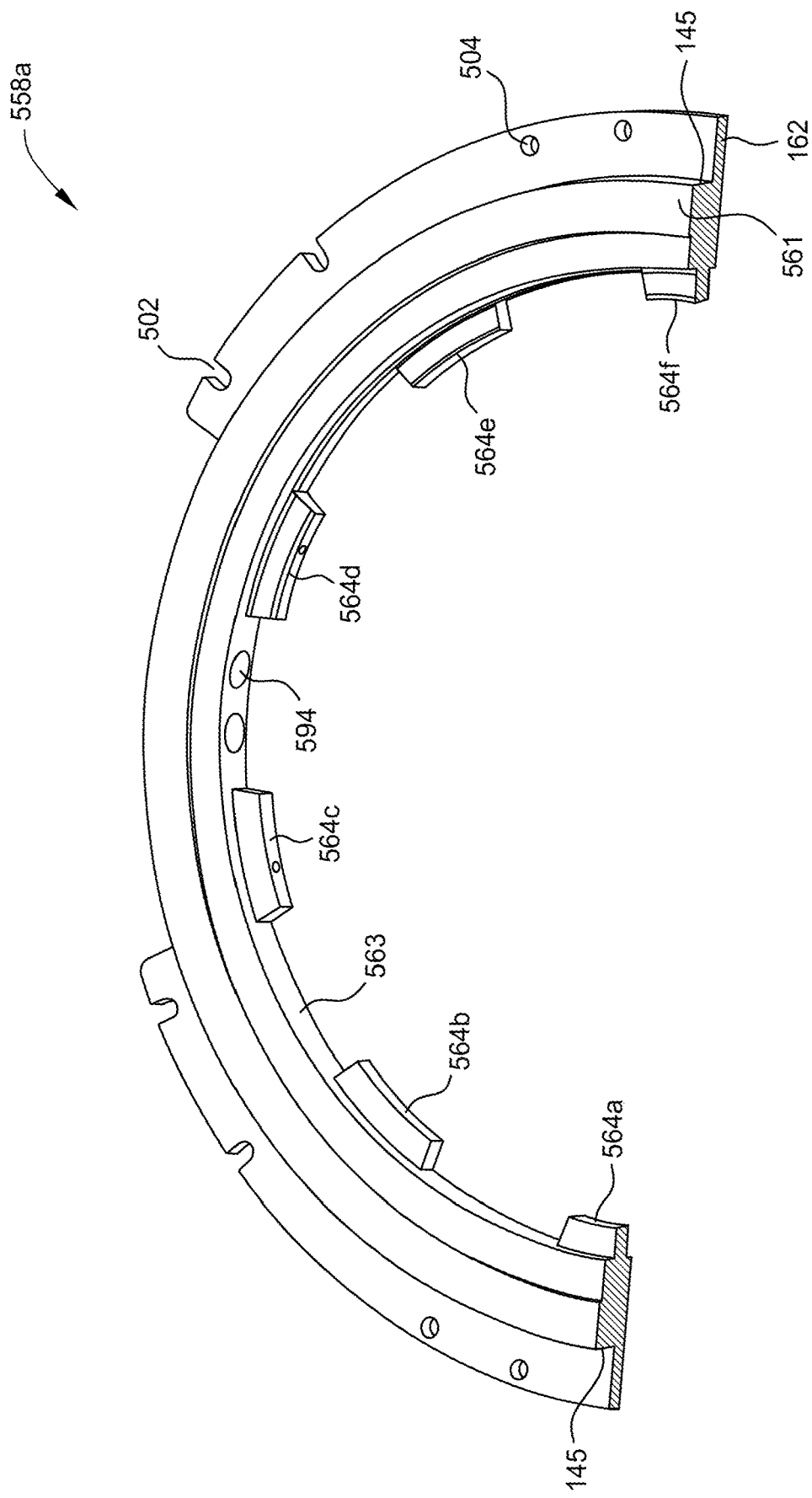
FIG. 5B illustrates a perspective view of one embodiment of a support ring.

FIG. 5B depicts one embodiment of a support section 558a (with support section 558b being a mirror image). The support ring 558a includes a main body 561 and one or more lips 162 (two are shown) disposed on the outer edge 145 of the support section 558a. The lip 162 extends radially outward from the support section 558a and facilitates handling of a faceplate 138 (shown in FIG. 5A).

In one embodiment depicted in FIG. 5B, the cantilever of the support section 558a is divided into a plurality of segmented cantilevers 564a-564f. The plurality of cantilevers 564a-564f operate similarly to the cantilever 164 shown in FIG. 3. The plurality of cantilevers 564a-564f extend from the inner surface 563 of the support section 558a. The plurality of cantilevers 564a-564f provide a greater surface area resulting in greater thermal choking efficiency, while maintaining spacing therebetween to reduce thermal mass. Openings 594 are formed through the inner surface of the support ring 158. The connecting ends 562 of the heating element 560 may be disposed with the openings 594.

The embodiments described herein advantageously provide a faceplate capable of being heated to high temperatures, such as above 350° C., with minimal droop or sagging. The thermal choke as disclosed allows the temperature of the faceplate to be increased to a high temperature, limiting the deposition of contaminant particles, while maintaining the sealing capabilities of the outboard disposed seals.

While the forgoing is directed to embodiments of the present disclosure, other and further embodiments of the disclosure may be devised without departing from the basic scope thereof, and the scope thereof is determined by the claims that follow.

What is claimed is:

1. A faceplate for a processing chamber, comprising:
   a body having a plurality of apertures formed therethrough, the body comprising a first extension and a second extension each extending outward from an outer surface of the body, the first extension and the second extension together defining a recess; and
   a heating element disposed within the body, the heating element circumscribing the plurality of apertures.

2. The faceplate of claim 1, wherein the first extension includes a stepped lower surface and a planar upper surface, the planar upper surface coplanar with an upper surface of the body.

3. The faceplate of claim 1, wherein the second extension includes a stepped upper surface and a planar lower surface, the planar lower surface coplanar with a lower surface of the body.

4. The faceplate of claim 1, wherein the first extension includes a nominal thickness of about 0.5 mm to about 5 mm.

5. The faceplate of claim 1, wherein the second extension includes a nominal thickness of about 0.5 mm to about 5 mm.

6. The faceplate of claim 1, wherein the body comprises aluminum.

7. The faceplate of claim 1, wherein the heating element includes a resistive heater.

8. The faceplate of claim 1, wherein the heating element is located radially inward of the first extension and the second extension.

9. A faceplate for a processing chamber, comprising:
   a body having a plurality of apertures formed therethrough, the body comprising a first extension and a second extension each extending outward from an outer surface of the body, the first extension and the second extension together defining a recess, each of the first extension and the second extension have a greater thickness at a radially inward edge thereof compared to a radially outward edge thereof; and a heating element disposed within the body, the heating element circumscribing the plurality of apertures, the heating element located radially inward of the first extension and the second extension.

10. The faceplate of claim 9, wherein the first extension includes a stepped lower surface and a planar upper surface, the planar upper surface coplanar with an upper surface of the body.

11. The faceplate of claim 9, wherein the second extension includes a stepped upper surface and a planar lower surface, the planar lower surface coplanar with a lower surface of the body.

12. The faceplate of claim 9, wherein the first extension includes a nominal thickness of about 0.5 mm to about 5 mm.

13. The faceplate of claim 9, wherein the second extension includes a nominal thickness of about 0.5 mm to about 5 mm.

14. The faceplate of claim 9, wherein the body comprises aluminum.

15. The faceplate of claim 9, wherein the heating element includes a resistive heater.

16. A faceplate for a processing chamber, comprising:

a body having a plurality of apertures formed therethrough extending from a first surface to a second surface, the body comprising a first extension and a second extension each extending outward from a perimeter of the body in a direction parallel to the first surface and the second surface, the first extension and the second extension together defining a recess, and wherein sidewalls of the recess comprise stepped surfaces oriented towards one another; and a heating element disposed within the body, the heating element circumscribing the plurality of apertures.

17. The process chamber of claim 16, wherein the first extension and the second extension include a nominal thickness of about 0.5 mm to about 5 mm.

18. The process chamber of claim 17, wherein the body comprises aluminum.

19. The process chamber of claim 17, wherein the body is circular.

20. The process chamber of claim 17, wherein the heating element has a circular cross section.

\* \* \* \* \*